(12) United States Patent
Tanaka et al.

(10) Patent No.: US 10,700,666 B2
(45) Date of Patent: Jun. 30, 2020

(54) FILTER CIRCUIT, MULTIPLEXER, AND MODULE

(71) Applicant: TAIYO YUDEN CO., LTD., Tokyo (JP)

(72) Inventors: Sachiko Tanaka, Tokyo (JP); Makoto Inoue, Tokyo (JP); Naoyuki Tasaka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 167 days.

(21) Appl. No.: 15/868,228

(22) Filed: Jan. 11, 2018

(65) Prior Publication Data

US 2018/0226952 A1 Aug. 9, 2018

(30) Foreign Application Priority Data

Feb. 8, 2017 (JP) .................................. 2017-021594
Feb. 8, 2017 (JP) .................................. 2017-021610

(51) Int. Cl.
*H03H 9/54* (2006.01)
*H03H 9/72* (2006.01)
(Continued)

(52) U.S. Cl.
CPC .......... *H03H 9/542* (2013.01); *H03H 7/0115* (2013.01); *H03H 7/0138* (2013.01);
(Continued)

(58) Field of Classification Search
CPC ...... H03H 9/0542; H03H 9/542; H03H 9/568; H03H 9/605; H03H 9/6483; H03H 9/706;
(Continued)

(56) References Cited

U.S. PATENT DOCUMENTS 2,212,840 A * 8/1940 Mason ................... H03H 9/542
333/187
4,577,168 A * 3/1986 Hartmann ............ H03H 9/6409
333/170
(Continued)

FOREIGN PATENT DOCUMENTS

GB   1 476 739 A   6/1977
JP   S37-9911 A    8/1962
(Continued)

OTHER PUBLICATIONS

Japanese Office Action dated Jul. 30, 2019, in a counterpart Japanese patent application No. 2017-021610. (A machine translation (not reviewed for accuracy) attached.)
(Continued)

*Primary Examiner* — Barbara Summons
(74) *Attorney, Agent, or Firm* — Chen Yoshimura LLP

(57) ABSTRACT

A filter circuit includes: a first element that is a first capacitor or a first inductor connected in series between input and output terminals; a second element that is connected in parallel to the first element between the input and output terminals, is a second inductor when the first element is the first capacitor, and is a second capacitor when the first element is the first inductor; a third element that is connected in parallel to the first element and in series with the second element between the input and output terminals, is a third inductor when the first element is the first capacitor, and is a third capacitor when the first element is the first inductor; and an acoustic wave resonator having a first end coupled to a first node between the second element and the third element and a second end coupled to a ground terminal.

12 Claims, 18 Drawing Sheets

(51) Int. Cl.

| | | |
|---|---|---|
| *H03H 9/64* | (2006.01) | |
| *H03H 9/17* | (2006.01) | |
| *H03H 7/01* | (2006.01) | |
| *H03H 9/60* | (2006.01) | |
| *H03H 9/05* | (2006.01) | |
| *H03H 9/56* | (2006.01) | |
| *H03H 9/70* | (2006.01) | |
| *H05K 1/16* | (2006.01) | |
| *H05K 1/18* | (2006.01) | |
| *H05K 5/06* | (2006.01) | |

(52) U.S. Cl.
CPC ........ *H03H 7/1708* (2013.01); *H03H 7/1775* (2013.01); *H03H 9/0542* (2013.01); *H03H 9/171* (2013.01); *H03H 9/568* (2013.01); *H03H 9/605* (2013.01); *H03H 9/64* (2013.01); *H03H 9/6483* (2013.01); *H03H 9/706* (2013.01); *H03H 9/72* (2013.01); *H03H 9/725* (2013.01); *H05K 1/16* (2013.01); *H05K 1/181* (2013.01); *H05K 5/065* (2013.01); *H05K 2201/0175* (2013.01); *H05K 2201/0979* (2013.01); *H05K 2201/09254* (2013.01); *H05K 2201/1006* (2013.01); *H05K 2201/10068* (2013.01); *H05K 2201/10083* (2013.01); *H05K 2201/10522* (2013.01)

(58) Field of Classification Search
CPC .......... H03H 9/725; H03H 9/171; H03H 9/64; H03H 9/72; H03H 7/0115; H03H 7/0138; H03H 7/1708; H03H 7/1775; H05K 1/16; H05K 1/181; H05K 5/065; H05K 2201/09254; H05K 2201/0979; H05K 2201/10068; H05K 2201/1006; H05K 2201/10083; H05K 2201/10522
USPC ......................... 333/187, 189, 193, 195, 133
See application file for complete search history.

(56) References Cited

U.S. PATENT DOCUMENTS

| | | | | |
|---|---|---|---|---|
| 5,077,545 | A | * | 12/1991 | Gopani ................ H03H 9/6409 |
| | | | | 310/313 D |
| 6,377,140 | B1 | * | 4/2002 | Ehara ................... H03H 9/6483 |
| | | | | 310/313 R |
| 10,243,538 | B2 | * | 3/2019 | Kato ...................... H03H 9/568 |
| 2004/0246077 | A1 | | 12/2004 | Misu et al. |
| 2005/0093652 | A1 | * | 5/2005 | Ma ........................ H03H 9/0095 |
| | | | | 333/187 |
| 2006/0139125 | A1 | | 6/2006 | Shiga-ken et al. |
| 2010/0026419 | A1 | | 2/2010 | Hara et al. |
| 2011/0090021 | A1 | | 4/2011 | Scheele et al. |
| 2017/0093370 | A1 | * | 3/2017 | Khlat .................... H03H 9/542 |
| 2017/0294896 | A1 | * | 10/2017 | Nosaka .................... H03H 9/72 |
| 2017/0338801 | A1 | * | 11/2017 | Hey-Shipton ........ H03H 9/6489 |
| 2018/0226952 | A1 | * | 8/2018 | Tanaka ..................... H05K 1/16 |

FOREIGN PATENT DOCUMENTS

| | | | |
|---|---|---|---|
| JP | S49-000373 B | | 1/1974 |
| JP | S50-75754 A | | 6/1975 |
| JP | H06-350374 A | | 12/1994 |
| JP | H07-038376 A | | 2/1995 |
| JP | H07-221504 A | | 8/1995 |
| JP | 2000-174586 A | | 6/2000 |
| JP | 2003-243966 A | | 8/2003 |
| JP | 2009-177766 A | | 8/2009 |
| JP | 2010-41141 A | | 2/2010 |
| JP | 2012-257050 A | * | 12/2012 |
| JP | 2014-239486 A | | 12/2014 |
| JP | 2016-136686 A | * | 7/2016 |
| WO | 2005/055423 A1 | | 6/2005 |

OTHER PUBLICATIONS

Japanese Office Action dated Feb. 12, 2019, in a counterpart Japanese patent application No. 2017-021610. (A machine translation (not reviewed for accuracy) attached.).

Japanese Office Action dated Nov. 12, 2019, in a counterpart Japanese patent application No. 2017-021610. (A machine translation (not reviewed for accuracy) attached.).

* cited by examiner 0.5 GHz TO 5 GHz 0.5 GHz TO 5 GHz 0.5 GHz TO 5 GHz 0.5 GHz TO 5 GHz 0.5 GHz TO 5 GHz

US 10,700,666 B2

FILTER CIRCUIT, MULTIPLEXER, AND MODULE

CROSS-REFERENCE TO RELATED APPLICATION

This application is based upon and claims the benefit of priority of the prior Japanese Patent Application No. 2017-021594, filed on Feb. 8, 2017, and the prior Japanese Patent Application No. 2017-021610, filed on Feb. 8, 2017, the entire contents of which are incorporated herein by reference.

FIELD

A certain aspect of the present invention relates to a filter circuit, a multiplexer, and a module.

BACKGROUND

Filters in which an inductor and a capacitor are combined (i.e., LC filters) have been used as low-pass filters (LPFs) and high-pass filters (HPFs). The LC filter has a structure having, for example, ceramic layers stacked. It has been known to connect a capacitor and an inductor to an acoustic wave filter as disclosed in, for example, Japanese Patent Application Publication No. 2010-41141.

SUMMARY OF THE INVENTION

According to a first aspect of the present invention, there is provided a filter circuit including: a first element that is a first capacitor or a first inductor connected in series between an input terminal and an output terminal; a second element that is connected in parallel to the first element between the input terminal and the output terminal, is a second inductor when the first element is the first capacitor, and is a second capacitor when the first element is the first inductor; a third element that is connected in parallel to the first element and in series with the second element between the input terminal and the output terminal, is a third inductor when the first element is the first capacitor, and is a third capacitor when the first element is the first inductor; and an acoustic wave resonator having a first end coupled to a first node, which is between the second element and the third element, and a second end coupled to a ground terminal.

According to a second aspect of the present invention, there is provided a multiplexer including the above filter circuit.

According to a third aspect of the present invention, there is provided a module including the above filter circuit.

DETAILED DESCRIPTION

In the LC filter, the steepness of the cutoff characteristic between the passband and the attenuation band and the insertion loss in the passband are in a trade-off relationship. Thus, securing of the insertion loss in the desired passband causes the deterioration of the steepness of the cutoff characteristic.

First Comparative Example

Figure 1A:
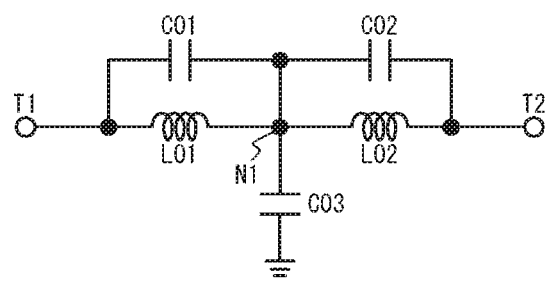
FIG. 1A is a circuit diagram of an LPF in accordance with a first comparative example.
Figure 1B:
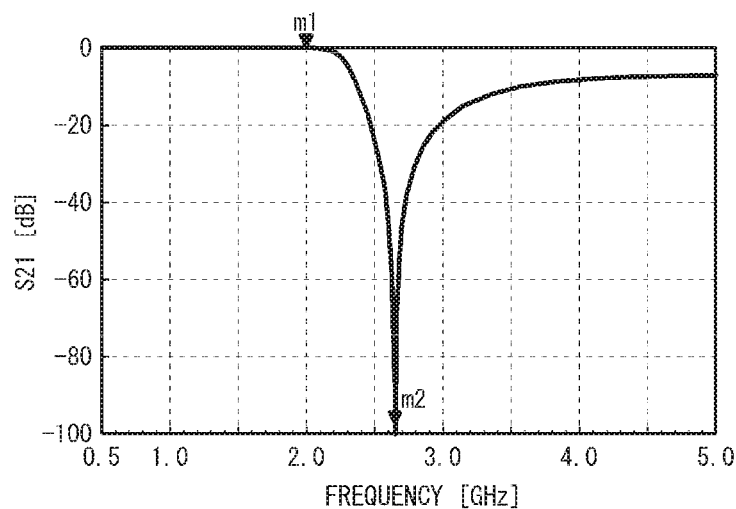
FIG. 1B illustrates the transmission characteristic.
Figure 1C:
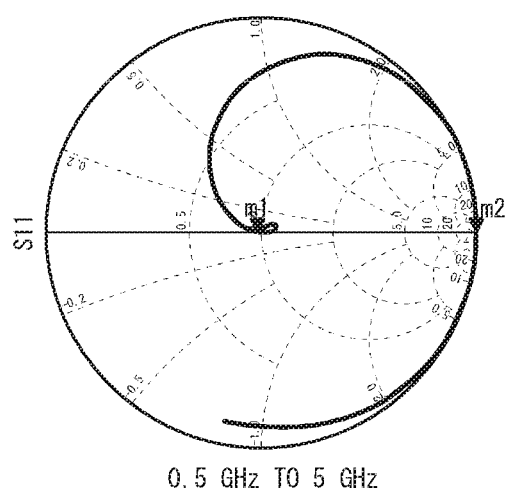
FIG. 1C is a Smith chart indicating the reflection characteristic.

A first comparative example is an exemplary LC filter. FIG. 1A is a circuit diagram of an LPF in accordance with the first comparative example, FIG. 1B illustrates the transmission characteristic, and FIG. 1C is a Smith chart indicating the reflection characteristic. As illustrated in FIG. 1A, capacitors C01 and C02 are connected in series between terminals T1 and T2. Inductors L01 and L02 are connected in series between the terminals T1 and T2. The capacitors C01 and C02 are connected in parallel to the inductors L01 and L02. A capacitor C03 is connected between a node N1, which is between the inductors L01 and L02, and a ground terminal.

The transmission characteristic S21 from the terminal T1 to the terminal T2 and the reflection characteristic S11 from the terminal T1 were simulated. The simulation conditions for FIG. 1B and FIG. 1C are as follows.
Terminals T1 and T2: terminated to ground via a 50Ω resistor
C01, C02: 1.8 pF
C03: 1.6 pF
L01, L02: 2 nH In FIG. 1B and FIG. 1C, the frequency at which S21 is the greatest is represented by m1, and the frequency of the bottom of the attenuation pole that is located at a frequency higher than the frequency m1 and closest to m1 is represented by m2. This also applies to the LPFs described hereinafter. The magnitude of S21 and the magnitude/angle of S11 at each of the frequencies m1 and m2 are as follows.
Frequency m1=1.980 GHz, S21=−0.00 dB, S11=0.02/−6.4°
Frequency m2=2.650 GHz, S21=−97.8 dB, S11=1.0/0°

At the frequency m1, S21 is large (i.e., the loss is small), and S11 is substantially located at the center of the Smith chart. That is, high-frequency signals input from the terminal T1 are hardly reflected and attenuated by the LPF, and are then output from the terminal T2. At the frequency m2, S21 is small (i.e., the attenuation is large), and the magnitude of S11 is approximately 1. Thus, high-frequency signals input from the terminal T1 are mostly reflected and attenuated by the LPF, and are thus hardly output from the terminal T2. The difference between the frequencies m1 and m2 is 670 MHz.

Figure 2A:
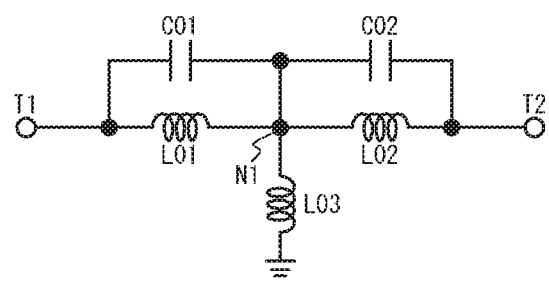
FIG. 2A is a circuit diagram of an HPF in accordance with the first comparative example.
Figure 2B:
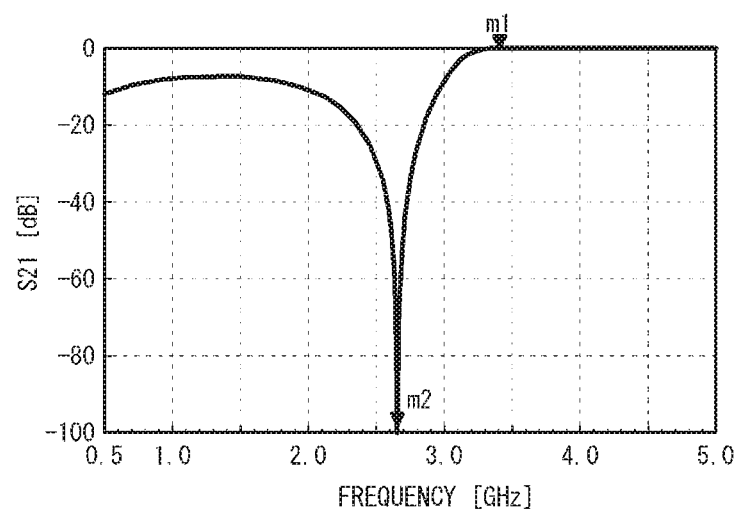
FIG. 2B illustrates the transmission characteristic.
Figure 2C:
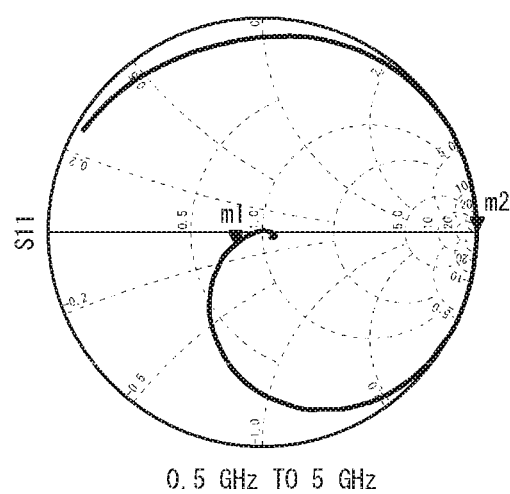
FIG. 2C is a Smith chart indicating the reflection characteristic.

FIG. 2A is a circuit diagram of an HPF in accordance with the first comparative example, FIG. 2B illustrates the transmission characteristic, and FIG. 2C is a Smith chart indicating the reflection characteristic. As illustrated in FIG. 2A, an inductor L03 is connected between the node N1 and the ground terminal. Other structures are the same as those of the LPF, and the description thereof is thus omitted.

The simulation conditions for FIG. 2A and FIG. 2B are as follows.
Terminals T1 and T2: terminated to ground via a 50Ω resistor
C01, C02: 1.8 pF
L01, L02: 2 nH
L03: 2.2 nF In FIG. 2B and FIG. 2C, the frequency at which S21 is the greatest is represented by m1, and the frequency of the bottom of the attenuation pole that is located at a frequency lower than the frequency m1 and closest to m1 is represented by m2. This also applies to the HPFs described hereinafter. The magnitude of S21 and the magnitude/angle of S11 at each of the frequencies m1 and m2 are as follows.
Frequency m1=3.400 GHz, S21=−0.00 dB, S11=0.00/3.0°
Frequency m2=2.650 GHz, S21=−98.1 dB, S11=1.0/0°
The difference between the frequencies m1 and m2 is 750 MHz.

As described in the first comparative example, in the LC filter, the difference between the frequencies m1 and m2 is hundreds of megahertz, and the cutoff characteristic between the passband and the attenuation band is not steep. When the frequencies m1 and m2 are made to be closer to each other, S21 at the frequency m1 becomes smaller (i.e., the loss becomes larger). As described above, when the insertion loss in the passband is to be secured, the steepness of the cutoff characteristic between the passband and the attenuation band is not improved.

First Embodiment

Figure 3A:
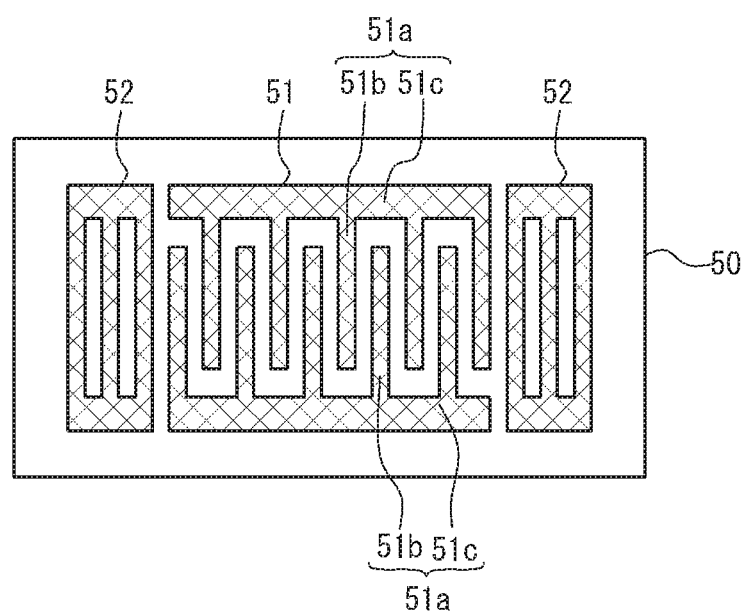
FIG. 3A is a plan view of a surface acoustic wave resonator.
Figure 3B:
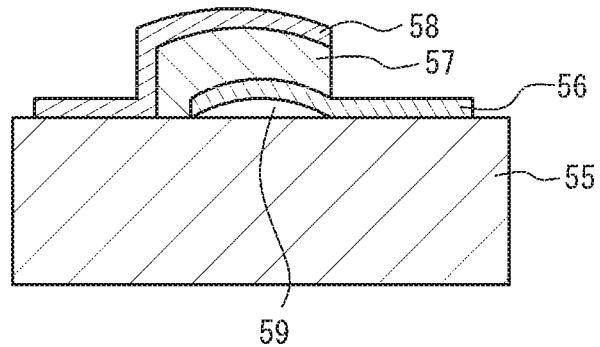
FIG. 3B is a cross-sectional view of a piezoelectric thin film resonator.

A first embodiment is an exemplary filter circuit serving the function of an LPF. Examples of the acoustic wave resonator used in the embodiment will be described. FIG. 3A is a plan view of a surface acoustic wave resonator, and FIG. 3B is a cross-sectional view of a piezoelectric thin film resonator. As illustrated in FIG. 3A, an Interdigital Transducer (IDT) 51 and reflectors 52 are formed on a piezoelectric substrate 50. The IDT 51 has a pair of comb-shaped electrodes 51a facing each other. The comb-shaped electrode 51a has a plurality of electrode fingers 51b and a bus bar 51c connecting the electrode fingers 51b. The reflectors 52 are located at both sides of the IDT 51. The IDT 51 excites a surface acoustic wave on the piezoelectric substrate 50. The piezoelectric substrate 50 is, for example, a lithium tantalate substrate or a lithium niobate substrate. The IDT 51 and the reflectors 52 are formed of, for example, an aluminum film or a copper film. The piezoelectric substrate 50 may be bonded on the lower surface of a support substrate such as a sapphire substrate, an alumina substrate, a spinel substrate, or a silicon substrate. A protective film or a temperature compensation film covering the IDT 50 and the reflectors 52 may be provided.

As illustrated in FIG. 3B, a piezoelectric film 57 is located on a substrate 55. A lower electrode 56 and an upper electrode 58 are located so as to sandwich the piezoelectric film 57. An air gap 59 is formed between the lower electrode 56 and the substrate 55. The lower electrode 56 and the upper electrode 58 excite an acoustic wave in the thickness extension mode inside the piezoelectric film 57. The lower electrode 56 and the upper electrode 58 are formed of, for example, a metal film such as a ruthenium film. The piezoelectric film 57 is, for example, an aluminum nitride film. The substrate 55 is, for example, a silicon substrate, a sapphire substrate, an alumina substrate, a spinel substrate, or a glass substrate.

Figure 4A:
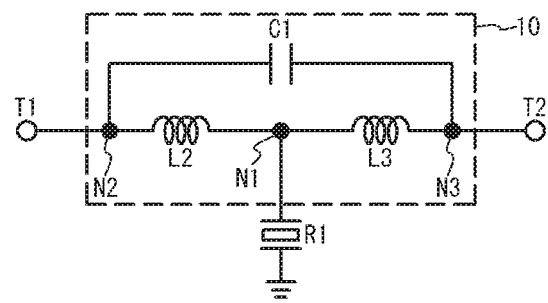
FIG. 4A is a circuit diagram of an LPF in accordance with a first embodiment.
Figure 4B:
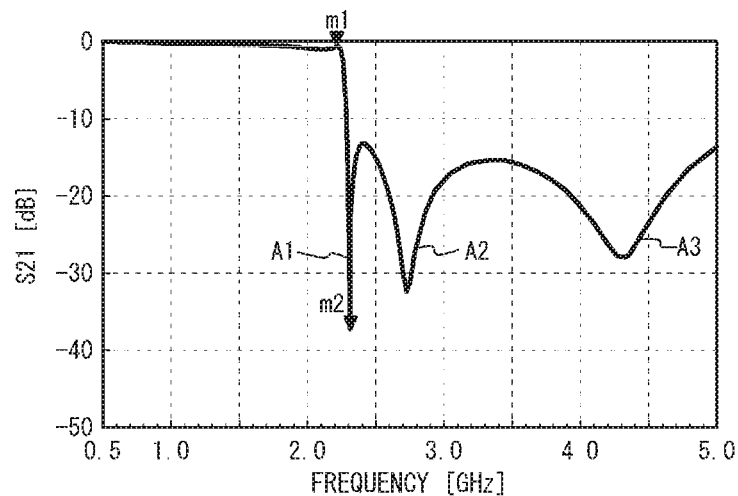
FIG. 4B illustrates the transmission characteristic.
Figure 4C:
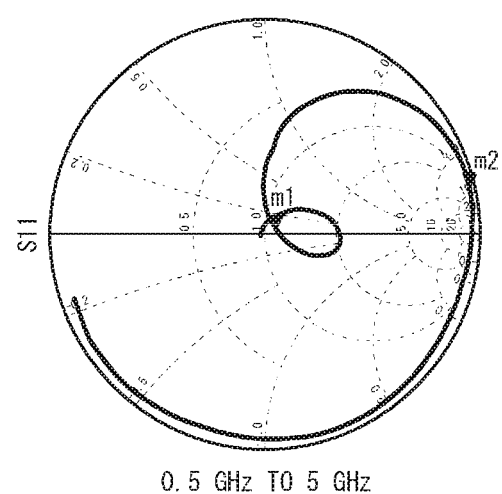
FIG. 4C is a Smith chart indicating the reflection characteristic.

FIG. 4A is a circuit diagram of an LPF in accordance with the first embodiment, FIG. 4B illustrates the transmission characteristic, and FIG. 4C is a Smith chart indicating the reflection characteristic. As illustrated in FIG. 4A, a capacitor C1 is connected in series between the terminals T1 and T2. An inductor L2 is connected in parallel to the capacitor C1 between the terminals T1 and T2. An inductor L3 is connected in parallel to the capacitor C1 and in series with the inductor L2 between the terminals T1 and T2. The node N1 is a node between the inductors L2 and L3. A node N2 is a node to which the capacitor C1 and the inductor L2 are commonly connected. A node N3 is a node to which the capacitor C1 and the inductor L3 are commonly connected. A first end of an acoustic wave resonator R1 is coupled to the node N1, and a second end of the acoustic wave resonator R1 is coupled to the ground terminal. The acoustic wave resonator R1 is a one-port resonator. Formed is an LC parallel resonant circuit 10 in which the inductors L2 and L3 are connected in parallel to the capacitor C1 between the nodes N2 and N3.

The simulation conditions for FIG. 4B and FIG. 4C are as follows.
Terminals T1 and T2: terminated to ground via a 50Ω resistor
C1: 1.5 pF
L2, L3: 1.5 nH R1: Piezoelectric thin film resonator having a resonant frequency of 2.26 GHz and an antiresonant frequency of 2.33 GHz As illustrated in FIG. 4B, an attenuation pole A1 mainly formed by the resonant frequency of the acoustic wave resonator R1 is formed at the frequency m2. The attenuation poles A2 and A3 mainly formed by the capacitor C1 and the inductors L2 and L3 (the LC parallel resonant circuit 10) are formed at frequencies higher than the attenuation pole A1.

For example, when the capacitance of the capacitor C1 is made to be constant and the inductance of the inductor L1 is increased, the attenuation poles A2 and A3 shift to lower frequencies, and the attenuation pole A1 shifts to a higher frequency. When the inductance of the inductor L1 is made to be constant and the capacitance of the capacitor C1 is increased, the attenuation pole A2 shifts to a further lower frequency, and the attenuation poles A1 and A3 shift to higher frequencies. As described above, the attenuation pole can be formed at a desired frequency by appropriately setting the capacitor C1 and the inductor L1.

Since the attenuation pole A1 is mainly formed by the resonant frequency of the acoustic wave resonator R1, the cutoff characteristic can be steepened. When the attenuation poles A1 and A2 become closer to each other and the attenuation poles A1 and A2 form an attenuation pole having one local minimum, the steepness of the attenuation pole A1 cannot be achieved. Thus, each of the attenuation poles A1 and A2 preferably has a local minimum.

In FIG. 4B and FIG. 4C, the magnitude of S21 and the magnitude/angle of S11 at each of the frequencies m1 and m2 are as follows.
Frequency m1=2.223 GHz, S21=−0.55 dB, S11=0.06/18°
Frequency m2=2.314 GHz, S21=−37.1 dB, S11=0.98/13°

In the first embodiment, the loss at the frequency m1 is as good as −0.55 dB, and the difference between the frequencies m1 and m2 is 91 MHz, which is less than that of the first comparative example by approximately one order of magnitude. As described above, the insertion loss in the passband can be reduced, and the steepness of the cutoff characteristic between the passband and the attenuation band can be improved.

Figure 5:
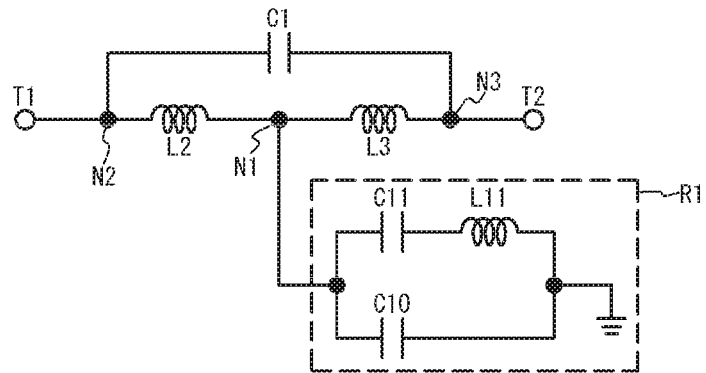
FIG. 5 is a circuit diagram illustrating an equivalent circuit of a filter circuit in accordance with the first embodiment.

FIG. 5 is a circuit diagram of an equivalent circuit of the filter circuit in accordance with the first embodiment. As illustrated in FIG. 5, the acoustic wave resonator R1 can be equivalently represented by capacitors C10 and C11 and an inductor L11. The attenuation poles A1 through A3 are determined by the combined impedance of the capacitors C1, C10 and C11 and the inductors L2, L3 and L11. Thus, the frequency of the bottom of the attenuation pole A1 is formed by the resonant frequency of the acoustic wave resonator R1, but differs from the resonant frequency of the acoustic wave resonator R1 alone. The frequencies of the bottoms of the attenuation poles A2 and A3 are formed by the capacitor C1 and the inductors L2 and L3, but are affected by the acoustic wave resonator R1.

First Variation of the First Embodiment

Figure 6A:
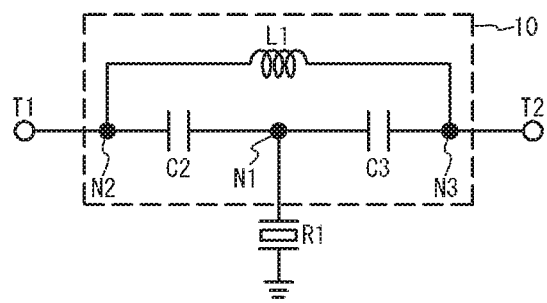
FIG. 6A is a circuit diagram of an LPF in accordance with a first variation of the first embodiment.
Figure 6B:
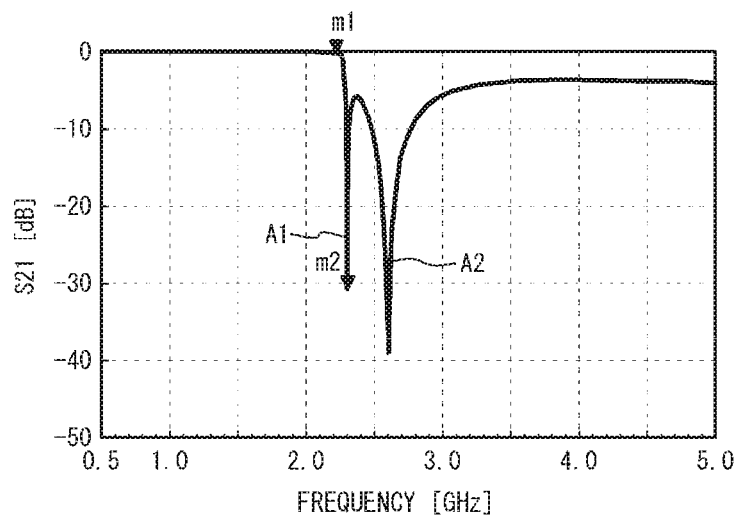
FIG. 6B illustrates the transmission characteristic.
Figure 6C:
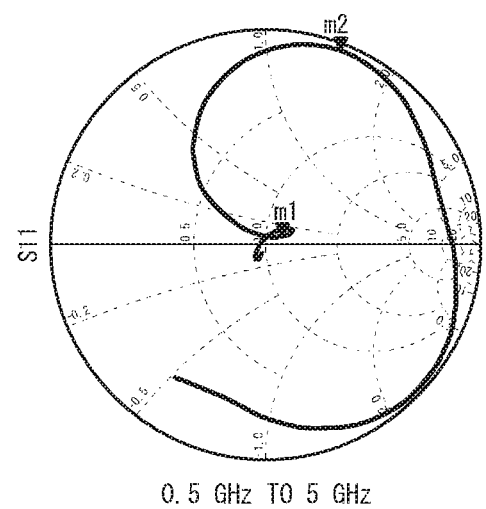
FIG. 6C is a Smith chart indicating the reflection characteristic.

A first variation of the first embodiment is an example in which the inductor and the capacitor in the LC parallel resonant circuit 10 are reversed. FIG. 6A is a circuit diagram of an LPF in accordance with the first variation of the first embodiment, FIG. 6B illustrates the transmission characteristic, and FIG. 6C is a Smith chart indicating the reflection characteristic. As illustrated in FIG. 6A, the first variation differs from the first embodiment in that the capacitor C1 and the inductors L2 and L3 are respectively replaced by the inductor L1 and capacitors C2 and C3. Other structures are the same as those of the first embodiment, and the description thereof is thus omitted.

The simulation conditions for FIG. 6B and FIG. 6C are as follows.
Terminals T1 and T2: terminated to ground via a 50Ω resistor
L1: 1.5 nH
C2, C3: 5.5 pF
R1: Piezoelectric thin film resonator having a resonant frequency of 2.26 GHz and an antiresonant frequency of 2.33 GHz.

As illustrated in FIG. 6B, as in the first embodiment, the attenuation poles A1 and A2 are formed. The attenuation pole A3 is not formed. In FIG. 6B and FIG. 6C, the magnitude of S21 and the magnitude/angle of S11 at each of the frequencies m1 and m2 are as follows.
Frequency m1=2.210 GHz, S21=−0.31 dB, S11=0.8/23°
Frequency m2=2.289 GHz, S21=−30.7 dB, S11=0.97/69°
The difference between the frequencies m1 and m2 is 79 MHz.

In the first variation of the first embodiment, even when the inductor and the capacitor of the LC parallel resonant circuit 10 are reversed, the insertion loss in the passband can be reduced and the steepness of the cutoff characteristic between the passband and the attenuation band can be improved.

Second Variation of the First Embodiment

Figure 7A:
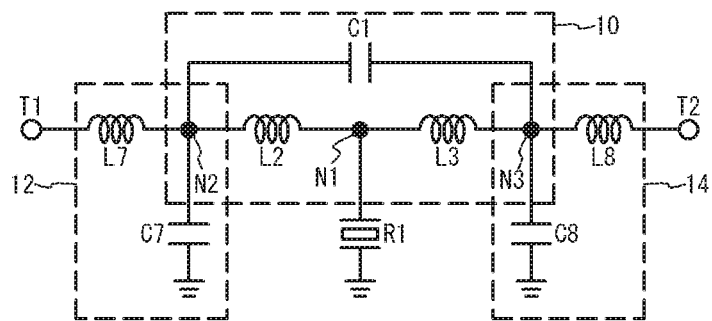
FIG. 7A is a circuit diagram of an LPF in accordance with a second variation of the first embodiment.
Figure 7B:
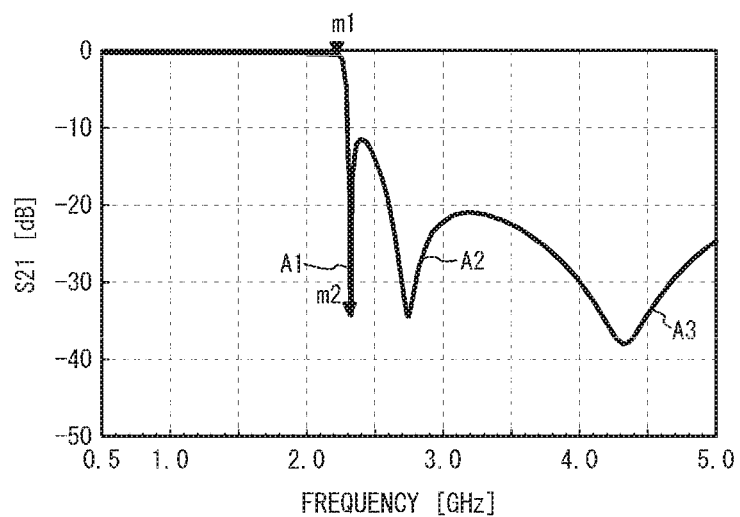
FIG. 7B illustrates the transmission characteristic.
Figure 7C:
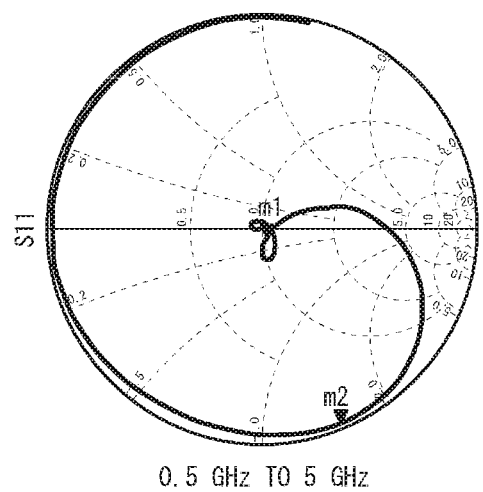
FIG. 7C is a Smith chart indicating the reflection characteristic.

A second variation of the first embodiment provides a matching circuit. FIG. 7A is a circuit diagram of an LPF in accordance with the second variation of the first embodiment, FIG. 7B illustrates the transmission characteristic, and FIG. 7C is a Smith chart indicating the reflection characteristic. As illustrated in FIG. 7A, the second variation differs from the first embodiment in that a matching circuit 12 is located between the terminal T1 and the inductor L2. The matching circuit 12 includes an inductor L7, which is connected in series between the terminal T1 and the node N2, and a capacitor C7, which is shunt-connected to the node N2. A matching circuit 14 is located between the inductor L3 and the terminal T2. The matching circuit 14 includes an inductor L8, which is connected between the node N3 and the terminal T2, and a capacitor C8, which is shunt-connected to the node N3. Other structures are the same as those of the first embodiment, and the description thereof is thus omitted.

The simulation conditions for FIG. 7B and FIG. 7C are as follows.
Terminals T1 and T2: terminated to ground via a 50Ω resistor
C1: 1.5 pF
C7, C8: 0.8 pF
L2, L3: 1.5 nH
L7, L8: 2.2 nH
R1: Piezoelectric thin film resonator having a resonant frequency of 2.26 GHz and an antiresonant frequency of 2.33 GHz.

As illustrated in FIG. 7B, as in the first embodiment, the attenuation poles A1 through A3 are formed. In FIG. 7B and FIG. 7C, the magnitude of S21 and the magnitude/angle of S11 at each of the frequencies m1 and m2 are as follows.
Frequency m1=2.215 GHz, S21=−0.40 dB, S11=0.04/−57°
Frequency m2=2.314 GHz, S21=−34.1 dB, S11=0.97/−68°
The difference between the frequencies m1 and m2 is 99 MHz.

In the second variation of the first embodiment, the insertion loss in the passband can be made to be less than that in the first embodiment by providing the matching circuits 12 and 14. Additionally, the passband can be widened. In addition, the attenuation in the attenuation band can be made to be greater than that in the first embodiment.

Third Variation of the First Embodiment

Figure 8A:
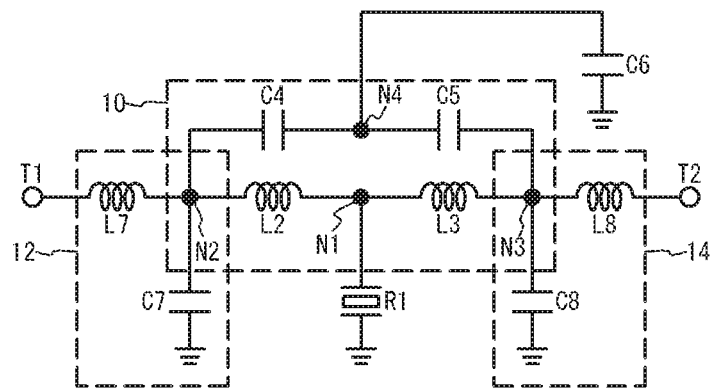
FIG. 8A is a circuit diagram of an LPF in accordance with a third variation of the first embodiment.
Figure 8B:
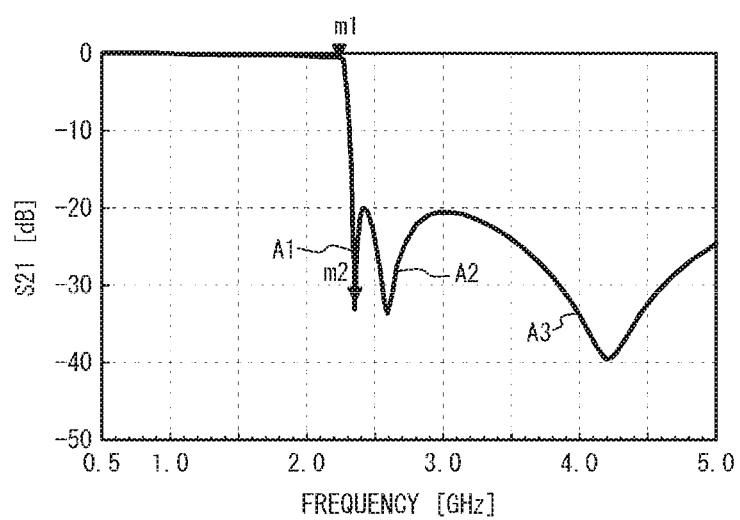
FIG. 8B illustrates the transmission characteristic.
Figure 8C:
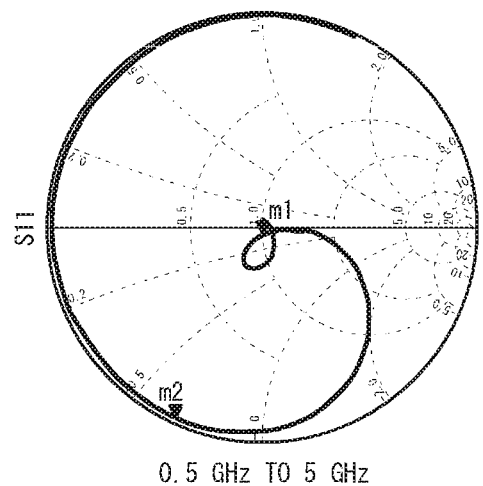
FIG. 8C is a Smith chart indicating the reflection characteristic.

A third variation of the first embodiment divides the capacitor C1. FIG. 8A is a circuit diagram of an LPF in accordance with the third variation of the first embodiment, FIG. 8B illustrates the transmission characteristic, and FIG. 8C is a Smith chart indicating the reflection characteristic. As illustrated in FIG. 8A, the third variation differs from the second variation of the first embodiment in that the capacitor C1 is serially divided into capacitors C4 and C5. A node N4 is a node between the capacitors C4 and C5. A first end of a capacitor C6 is coupled to the node N4, and a second end is coupled to a ground terminal. Other structures are the same as those of the second variation of the first embodiment, and the description thereof is thus omitted.

The simulation conditions for FIG. 8B and FIG. 8C are as follows.
Terminals T1 and T2: terminated to ground via a 50Ω resistor
C4, C5: 3.3 pF
C6: 0.5 pF
C7, C8: 0.6 pF
L2, L3: 1.6 nH
L7, L8: 2.7 nH
R1: Piezoelectric thin film resonator having a resonant frequency of 2.26 GHz and an antiresonant frequency of 2.33 GHz As illustrated in FIG. 8B, as in the first embodiment, the attenuation poles A1 through A3 are formed. In FIG. 8B and FIG. 8C, the magnitude of S21 and the magnitude/angle of S11 at each of the frequencies m1 and m2 are as follows.
Frequency m1=2.232 GHz, S21=−0.39 dB, S11=0.04/−90°
Frequency m2=2.350 GHz, S21=−31.8 dB, S11=0.97/−114°
The difference between the frequencies m1 and m2 is 118 MHz.

The third variation of the first embodiment can make the attenuation in the attenuation band larger than that in the second variation of the first embodiment.

Fourth Variation of the First Embodiment

Figure 9A:
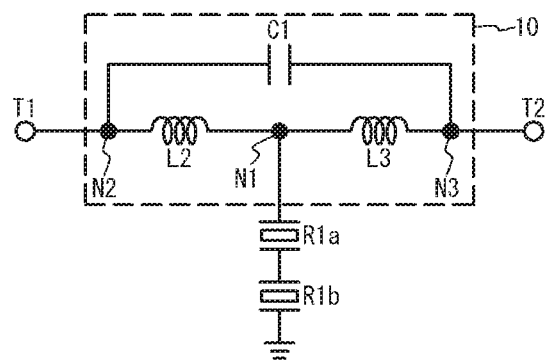
FIG. 9A and FIG. 9B are circuit diagrams of filter circuits in accordance with a fourth variation of the first embodiment.
Figure 9B:
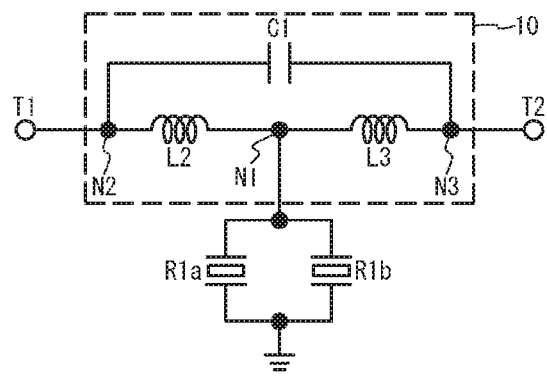

FIG. 9A and FIG. 9B are circuit diagrams of a filter circuit in accordance with a fourth variation of the first embodiment. As illustrated in FIG. 9A, the acoustic wave resonator R1 may be serially divided into a plurality of acoustic wave resonators R1a and R1b. Alternatively, as illustrated in FIG. 9B, the acoustic wave resonator R1 may be divided into a plurality of acoustic wave resonators R1a and R1b in parallel. Other structures are the same as those of the first embodiment, and the description thereof is thus omitted.

Second Embodiment

Figure 10A:
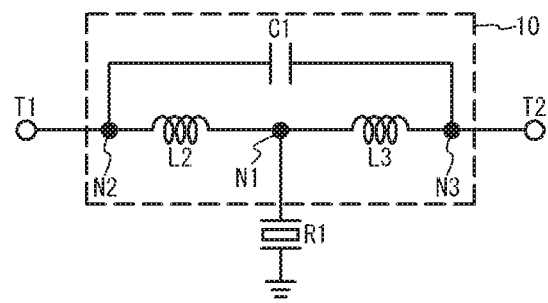
FIG. 10A is a circuit diagram of an HPF in accordance with a second embodiment.
Figure 10B:
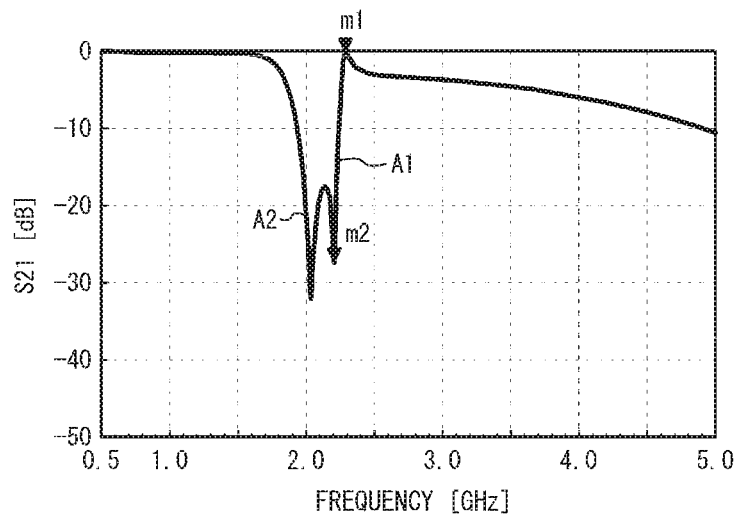
FIG. 10B illustrates the transmission characteristic.
Figure 10C:
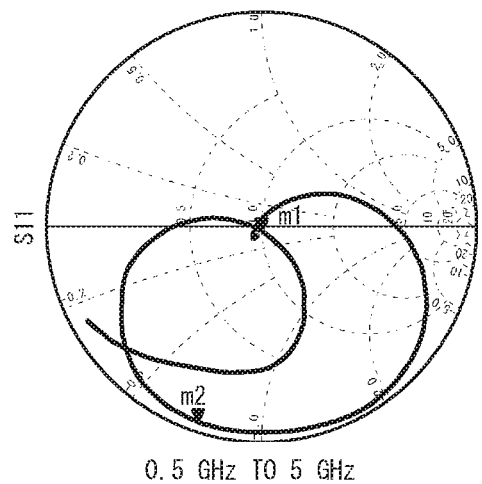
FIG. 10C is a Smith chart indicating the reflection characteristic.

A second embodiment is an exemplary filter circuit serving the function of an HPF. FIG. 10A is a circuit diagram of an HPF in accordance with the second embodiment, FIG. 10B illustrates the transmission characteristic, and FIG. 10C is a Smith chart indicating the reflection characteristic. As illustrated in FIG. 10A, the circuit is the same as the circuit of the first embodiment.

The simulation conditions for FIG. 10B and FIG. 10C are as follows.
Terminals T1 and T2: terminated to ground via a 50Ω resistor
C1: 3.9 pF
L2, L3: 0.9 nH
R1: Piezoelectric thin film resonator having a resonant frequency of 2.26 GHz and an antiresonant frequency of 2.33 GHz As illustrated in FIG. 10B, the attenuation pole A1 mainly formed by the resonant frequency of the acoustic wave resonator R1 is formed at the frequency m2. The attenuation pole A2 mainly formed by the capacitor C1 and the inductors L2 and L3 (the LC parallel resonant circuit 10) is formed at a frequency lower than the attenuation pole A1.

In FIG. 10B and FIG. 10C, the magnitude of S21 and the magnitude/angle of S11 at each of the frequencies m1 and m2 are as follows.
Frequency m1=2.287 GHz, S21=−0.19 dB, S11=0.02/−98°
Frequency m2=2.202 GHz, S21=−27.0 dB, S11=0.95/−108°

The second embodiment can make the loss at the frequency m1 as small as −0.19 dB, and the difference between the frequencies m1 and m2 85 MHz, which is smaller than that of the first comparative example by near one order of magnitude. As described above, the insertion loss in the passband can be reduced, and the steepness of the cutoff characteristic between the passband and the attenuation band can be improved.

First Variation of the Second Embodiment

Figure 11A:
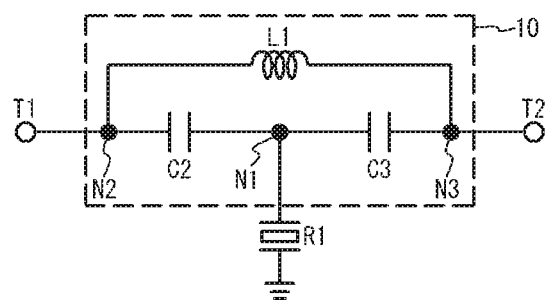
FIG. 11A is a circuit diagram of an HPF in accordance with a first variation of the second embodiment.
Figure 11B:
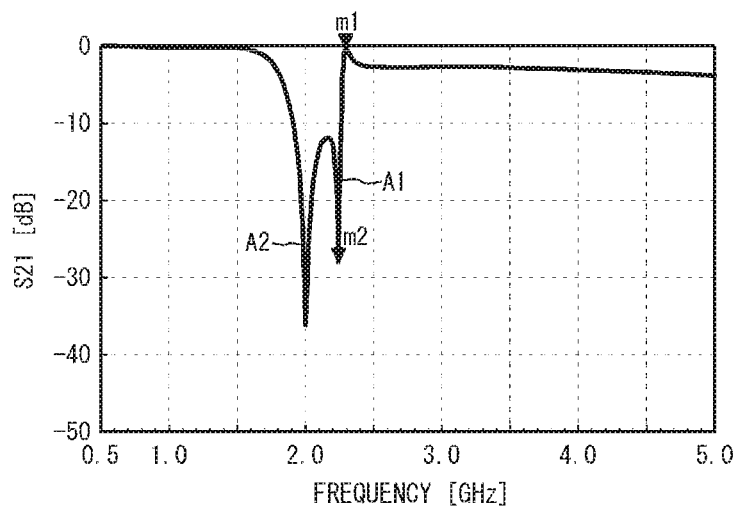
FIG. 11B illustrates the transmission characteristic.
Figure 11C:
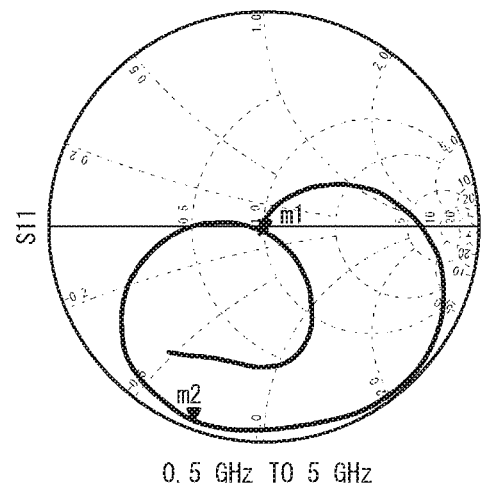
FIG. 11C is a Smith chart indicating the reflection characteristic.

A first variation of the second embodiment reverses the inductor and the capacitor in the LC parallel resonant circuit 10. FIG. 11A is a circuit diagram of an HPF in accordance with the first variation of the second embodiment, FIG. 11B illustrates the transmission characteristic, and FIG. 11C is a Smith chart indicating the reflection characteristic. As illustrated in FIG. 11A, the first variation differs from the second embodiment in that the capacitor C1 and the inductors L2 and L3 are respectively replaced by the inductor L1 and the capacitors C2 and C3. Other structures are the same as those of the second embodiment, and the description thereof is thus omitted.

The simulation conditions for FIG. 11B and FIG. 11C are as follows.
Terminals T1 and T2: terminated to ground via a 50Ω resistor
C2, C3: 7.1 pF
L1: 2 nH
R1: Piezoelectric thin film resonator having a resonant frequency of 2.26 GHz and an antiresonant frequency of 2.33 GHz.

As illustrated in FIG. 11B, as in the second embodiment, the attenuation poles A1 and A2 are formed. In FIG. 11B and FIG. 11C, the magnitude of S21 and the magnitude/angle of S11 at each of the frequencies m1 and m2 are as follows.
Frequency m1=2.291 GHz, S21=−0.26 dB, S11=0.03/−83°
Frequency m2=2.237 GHz, S21=−27.7 dB, S11=0.96/−110°
The difference between the frequencies m1 and m2 is 54 MHz.

In the first variation of the second embodiment, even when the inductor and the capacitor of the LC parallel resonant circuit 10 are reversed, the insertion loss in the passband can be reduced and the steepness of the cutoff characteristic between the passband and the attenuation band can be improved.

Second Variation of the Second Embodiment

Figure 12A:
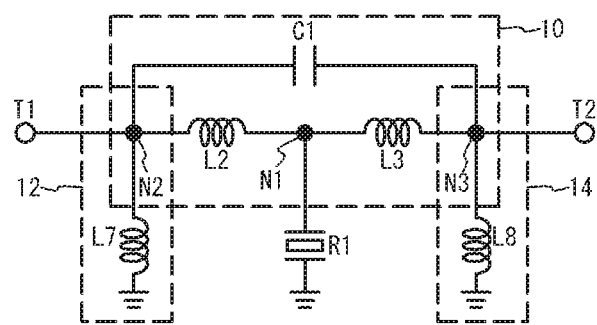
FIG. 12A is a circuit diagram of an HPF in accordance with a second variation of the second embodiment.
Figure 12B:
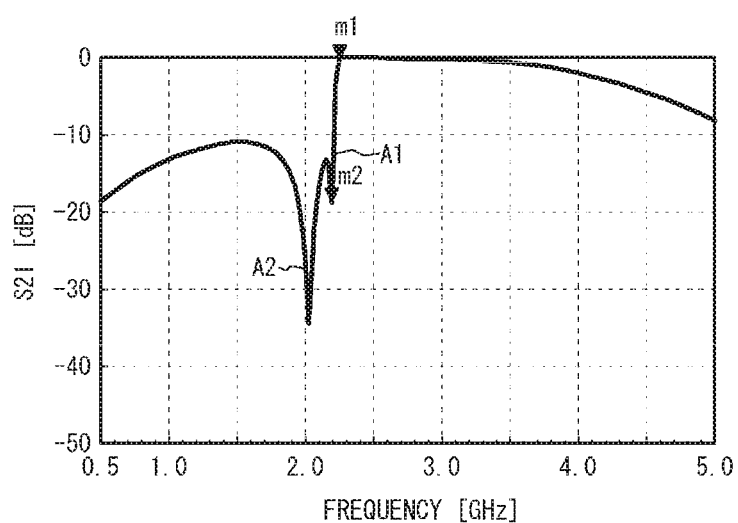
FIG. 12B illustrates the transmission characteristic.
Figure 12C:
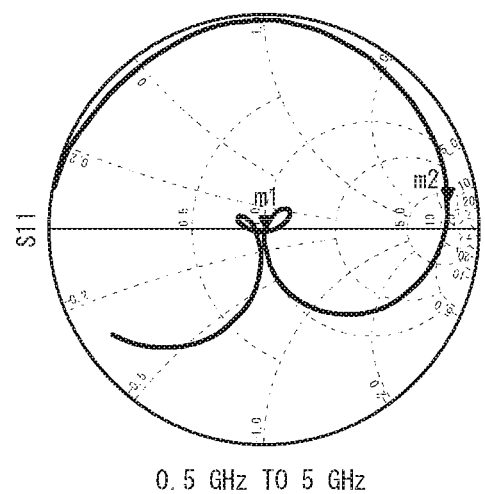
FIG. 12C is a Smith chart indicating the reflection characteristic.

A second variation of the second embodiment provides a matching circuit to the second embodiment. FIG. 12A is a circuit diagram of an HPF in accordance with the second variation of the second embodiment, FIG. 12B illustrates the transmission characteristic, and FIG. 12C is a Smith chart indicating the reflection characteristic. As illustrated in FIG. 12A, the second variation differs from the second embodiment in that the matching circuit 12 is located between the terminal T1 and the inductor L2. The matching circuit 12 includes the inductor L7 shunt-connected to the node N2. The matching circuit 14 is located between the inductor L3 and the terminal T2. The matching circuit 14 includes the inductor L8 shunt-connected to the node N3. Other structures are the same as those of the second embodiment, and the description thereof is thus omitted.

The simulation conditions for FIG. 12B and FIG. 12C are as follows.
Terminals T1 and T2: terminated to ground via a 50Ω resistor
C1: 3.9 pF
L2, L3: 0.9 nH
L7, L8: 2.5 nH
R1: Piezoelectric thin film resonator having a resonant frequency of 2.26 GHz and an antiresonant frequency of 2.33 GHz As illustrated in FIG. 12B, as in the second embodiment, the attenuation poles A1 and A2 are formed. In FIG. 12B and FIG. 12C, the magnitude of S21 and the magnitude/angle of S11 at each of the frequencies m1 and m2 are as follows.
Frequency m1=2.260 GHz, S21=−0.19 dB, S11=0.01/−8°
Frequency m2=2.202 GHz, S21=−18.6 dB, S11=0.88/9°
The difference between the frequencies m1 and m2 is 58 MHz.

In the second variation of the second embodiment, the insertion loss in the passband can be made to be smaller than that in the second embodiment by providing the matching circuits 12 and 14. In addition, the passband can be widened. In addition, the attenuation in the attenuation band can be made to be greater than that in the first embodiment.

Third Variation of the Second Embodiment

Figure 13A:
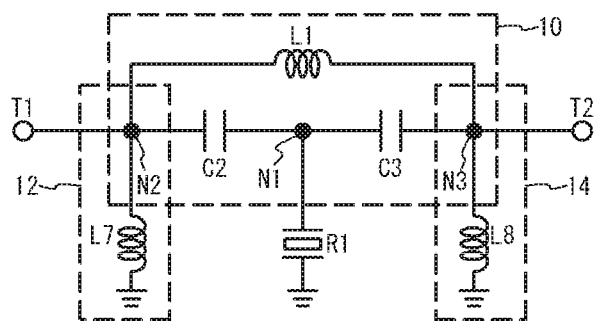
FIG. 13A is a circuit diagram of an HPF in accordance with a third variation of the second embodiment.
Figure 13B:
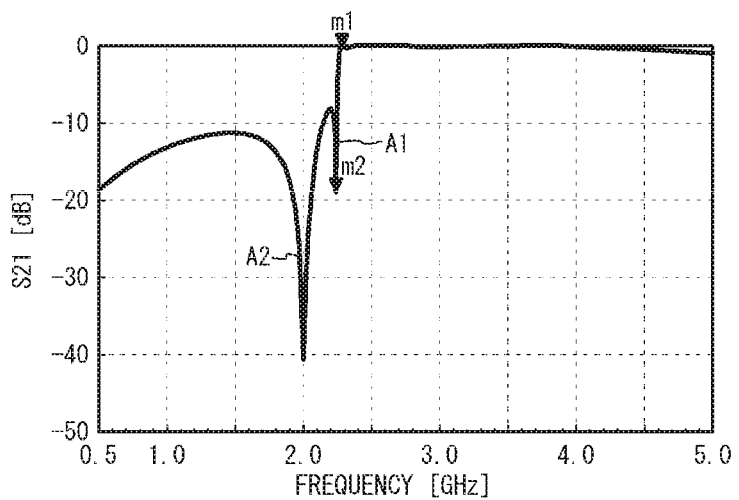
FIG. 13B illustrates a transmission characteristic.
Figure 13C:
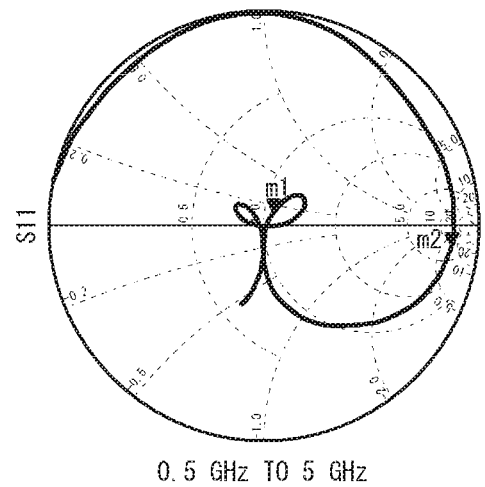
FIG. 13C is a Smith chart indicating the reflection characteristic.

A third variation of the second embodiment provides a matching circuit to the first variation of the second embodiment. FIG. 13A is a circuit diagram of an HPF in accordance with the third variation of the second embodiment, FIG. 13B illustrates the transmission characteristic, and FIG. 13C is a Smith chart indicating the reflection characteristic. As illustrated in FIG. 13A, the third variation differs from the first variation of the second embodiment in that the matching circuit 12 is located between the terminals T1 and the capacitor C2. The matching circuit 14 is located between the terminal T2 and the capacitor C3. The matching circuits 12 and 14 are the same as those of the second variation of the second embodiment. Other structures are the same as those of the second variation of the second embodiment, and the description thereof is thus omitted.

The simulation conditions for FIG. 13B and FIG. 13C are as follows.
Terminals T1 and T2: terminated to ground via a 50Ω resistor
L1: 2.0 nH
C2, C3: 7.1 pF
L7, L8: 2.6 nH
R1: Piezoelectric thin film resonator having a resonant frequency of 2.26 GHz and an antiresonant frequency of 2.33 GHz As illustrated in FIG. 13B, as in the second embodiment, the attenuation poles A1 and A2 are formed. In FIG. 13B and FIG. 13C, the magnitude of S21 and the magnitude/angle of S11 at each of the frequencies m1 and m2 are as follows.
Frequency m1=2.276 GHz, S21=−0.20 dB, S11=0.07/50°
Frequency m2=2.237 GHz, S21=−18.9 dB, S11=0.88/−6°
The difference between the frequencies m1 and m2 is 39 MHz.

In the third variation of the second embodiment, the insertion loss in the passband can be made to be smaller than that in the first variation of the second embodiment by providing the matching circuits 12 and 14. Additionally, the passband can be widened. In addition, the attenuation in the attenuation band can be made to be greater than that in the first embodiment.

Fourth Variation of the Second Embodiment

Figure 14A:
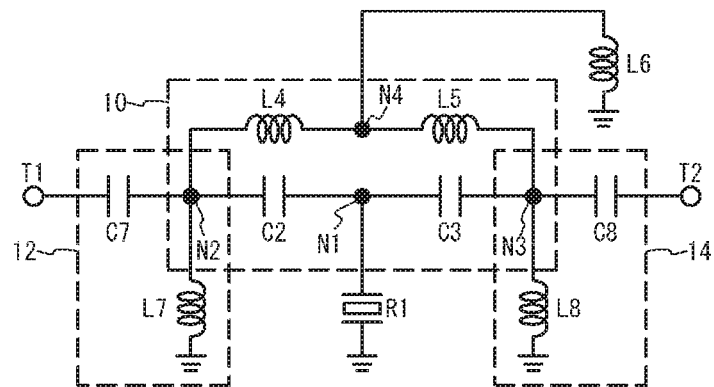
FIG. 14A is a circuit diagram of an HPF in accordance with a fourth variation of the second embodiment.
Figure 14B:
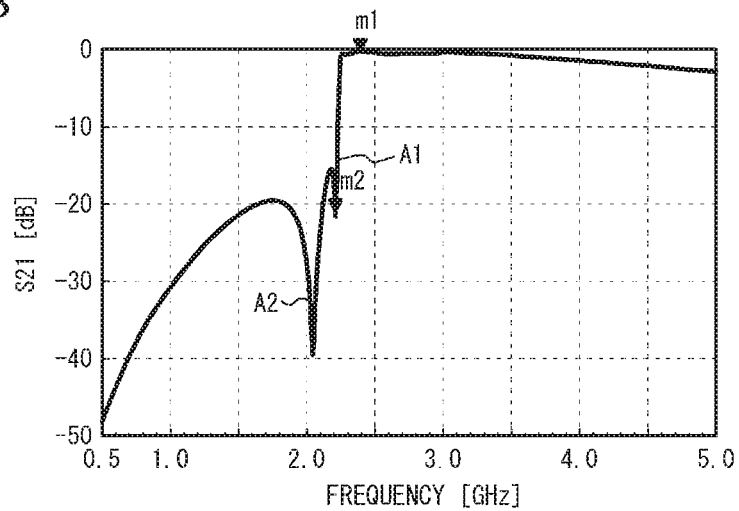
FIG. 14B illustrates the transmission characteristic.
Figure 14C:
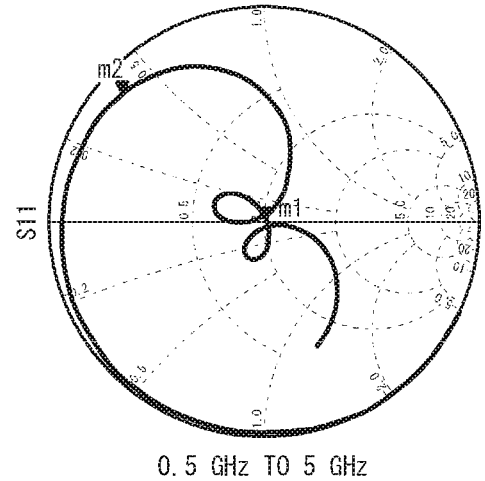
FIG. 14C is a Smith chart indicating the reflection characteristic.

A fourth variation of the second embodiment divides the inductor L1. FIG. 14A is a circuit diagram of an HPF in accordance with the fourth variation of the second embodiment, FIG. 14B illustrates the transmission characteristic, and FIG. 14C is a Smith chart indicating the reflection characteristic. As illustrated in FIG. 14A, the fourth variation differs from the third variation of the second embodiment in that the inductor L1 is serially divided into inductors L4 and L5. A first end of an inductor L6 is coupled to the node N4, and a second end is coupled to a ground terminal. The matching circuit 12 includes the capacitor C7 connected between the terminal T1 and the node N2. The matching circuit 14 includes the capacitor C8 connected between the terminal T2 and the node N3. Other structures are the same as those of the third variation of the second embodiment, and the description thereof is thus omitted.

The simulation conditions for FIG. 14B and FIG. 14C are as follows.
Terminals T1 and T2: terminated to ground via a 50Ω resistor
L4, L5: 1.3 nH
L6: 3.8 nH
L7, L8: 2.9 nH
C2, C3: 4.7 pF
C7, C8: 1.4 pF
R1: Piezoelectric thin film resonator having a resonant frequency of 2.26 GHz and an antiresonant frequency of 2.33 GHz As illustrated in FIG. 14B, as in the second embodiment, the attenuation poles A1 and A2 are formed. In FIG. 14B and FIG. 14C, the magnitude of S21 and the magnitude/angle of S11 at each of the frequencies m1 and m2 are as follows.
Frequency m1=2.400 GHz, S21=−0.12 dB, S11=0.01/78°
Frequency m2=2.220 GHz, S21=−21.1 dB, S11=0.90/−139°
The difference between the frequencies m1 and m2 is 180 MHz.

In the fourth variation of the second embodiment, the attenuation in the attenuation band can be made to be greater than that in the third variation of the second embodiment.

Fifth Variation of the Second Embodiment

As in the fourth variation of the first embodiment, also in the HPF, the acoustic wave resonator R1 may be serially divided into a plurality of acoustic wave resonators R1a and R1b as illustrated in FIG. 9A. Alternatively, as illustrated in FIG. 9B, the acoustic wave resonator R1 may be divided into a plurality of acoustic wave resonators R1a and R1b in parallel.

In the first and second embodiments and the variations thereof, the LC parallel resonant circuit 10 is connected in series between the terminal T1 (an input terminal) and the terminal T2 (an output terminal). A first end of the acoustic wave resonator R1 is coupled to the node N1 (a first node) and a second end is coupled to a ground terminal. Here, elements forming the LC parallel resonant circuit 10 are defined as follows. The capacitor C1 (a first capacitor) or the inductor L1 (a first inductor) having a first end coupled to the node N2 (a second node) and a second end coupled to the node N3 (a third node) is defined as a first element. The capacitor C2 (a second capacitor) or the inductor L2 (a second inductor) having a first end coupled to the node N2 and a second end coupled to the node N1 is defined as a second element. The inductor L3 (a third inductor) or the capacitor C3 (a third capacitor) having a first end coupled to the node N1 and a second end coupled to the node N3 is defined as a third element. To form the LC parallel resonant circuit 10 with the first through third elements, as described in the first embodiment and the second to fourth variations thereof and the second embodiment and the second variation thereof, when the first element is the capacitor C1, the second element and the third element are respectively the inductors L2 and L3. As described in the first variation of the first embodiment and the first, third, and fourth variations of the second embodiment, when the first element is the inductor L1, the second element and the third element are respectively the capacitors C2 and C3.

Therefore, as in the first and second embodiments and the variations thereof, the insertion loss at the frequency m1 (the passband) can be made to be approximately the same as those of the first and second comparative examples, and the steepness of the cutoff characteristic between the passband and the attenuation band can be improved.

As described in the first embodiment and the variations thereof, the attenuation poles A2 and A3 formed by the first element, the second element, and the third element are located at frequencies higher than the attenuation pole A1 formed by the acoustic wave resonator. Accordingly, the filter circuit functioning as an LPF is achieved.

As described in the second embodiment, the attenuation pole A2 formed by the first element, the second element, and the third element is located at a frequency lower than the attenuation pole A1 formed by the acoustic wave resonator. Accordingly, the filter circuit functioning as an HPF is achieved.

A bandpass filter may be formed by combining an LPF and an HPF.

The attenuation pole A1 is mainly formed by the resonant frequency of the acoustic wave resonator R1. However, the attenuation pole A1 is affected by the LC parallel resonant circuit 10 or the like. Thus, the frequency of the bottom of the attenuation pole A1 differs from the resonant frequency of the acoustic wave resonator R1 alone. The attenuation poles A2 and A3 are mainly formed by the LC parallel resonant circuit 10. However, the attenuation poles A2 and A3 are affected by the acoustic wave resonator R1. Thus, the frequencies of the bottoms of the attenuation poles A2 and A3 differ from the resonant frequency of the LC parallel resonant circuit 10 alone.

Since the attenuation pole A1 is mainly formed by the resonant frequency of the acoustic wave resonator R1, the steepness of the cutoff characteristic between the passband and the attenuation band can be improved. Additionally, since the attenuation poles A1 and A2 have different local minimums, the steepness of the cutoff characteristic can be further improved. In addition, the attenuation pole A2 can make the attenuation in the attenuation band larger.

As described in the first and second embodiments and the variations thereof, the capacitors C2 and C3 may have capacitances approximately equal to each other. The inductors L2 and L3 may have inductances approximately equal to each other. That is, the reactance of the first element may be approximately equal to the reactance of the second element.

The capacitors C2 and C3 may have different capacitances. The inductors L2 and L3 may have different inductances. That is, the reactance of the first element and the reactance of the second element may differ from each other.

In addition to the LC parallel resonant circuit 10, another LC parallel resonant circuit having a resonant frequency different from that of the LC parallel resonant circuit 10 may be located between the terminals T1 and T2. This structure can widen the attenuation band.

As described in the first embodiment and the first through third variations thereof and the second embodiment and the first through fourth variations thereof, the number of the acoustic wave resonators R1 connected in series between the node N1 and the ground terminal may be one. As described in the fourth variation of the first embodiment and the fifth variation of the second embodiment, a plurality of acoustic wave resonators R1a and R1b may be connected in series between the node N1 and the ground terminal. A plurality of acoustic wave resonators R1a and R1b may be connected in parallel between the node N1 and the ground terminal.

When a plurality of acoustic wave resonators R1a and R1b are provided, the acoustic wave resonators R1a and R1b may have approximately the same resonant frequency. The resonant frequency of at least one of a plurality of acoustic wave resonators R1a and R1b may be different from the resonant frequency of the remaining acoustic wave resonators. The attenuation band can be widened by making the resonant frequencies of the acoustic wave resonators R1a and R1b different from each other.

As described in the second and third variations of the first embodiment and the second through fourth variations of the second embodiment, a matching circuit may be located between the terminal T1 and the node N1, between the node N2 and the terminal T2, or between the terminal T1 and the node N1 and between the node N2 and the terminal T2. This structure can reduce the insertion loss in the passband and widen the passband.

As described in the third variation of the first embodiment, when the first element is a capacitor, the first element includes the capacitors C4 (a fourth element) and C5 (a fifth element) connected in series between the terminal T1 and the terminal T2. The capacitor C6 (a fourth capacitor) has a first end coupled to the node N4 (a fourth node) and a second end coupled to the ground terminal. As described in the fourth variation of the second embodiment, when the first element is an inductor, the first element includes the inductors L4 (the fourth element) and L5 (the fifth element) connected in series between the terminal T1 and the terminal T2. The inductor L6 (a fourth inductor) has a first end coupled to the node N4 (the fourth node) and a second end coupled to a ground terminal. This structure can improve the attenuation characteristic in the attenuation band.

The acoustic wave resonators R1, R1a, and R1b may include IDTs as illustrated in FIG. 3A, or piezoelectric thin film resonators as illustrated in FIG. 3B.

When the acoustic wave resonator is a piezoelectric thin film resonator, two acoustic wave resonators R1a and R1b are provided in series or in parallel between the node N1 and the ground terminal. The electrostatic capacitances, the resonant frequencies, and the antiresonant frequencies of the acoustic wave resonators R1a and R1b are made to be approximately equal to each other. Furthermore, the polarization directions of the piezoelectric films of the acoustic wave resonators R1a and R1b are made to be opposite to each other as viewed from the node N1 or the ground terminal. This configuration can reduce second harmonics generated by the acoustic wave resonators R1a and R1b.

Third Embodiment

Figure 15:
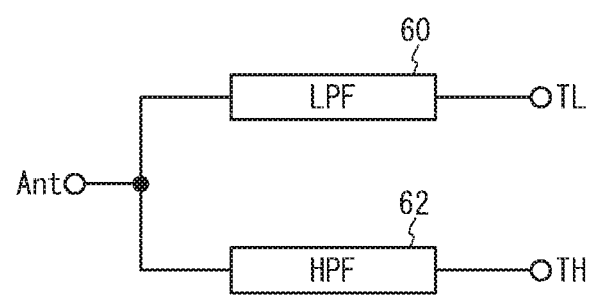
FIG. 15 is a circuit diagram of a diplexer in accordance with a third embodiment.

FIG. 15 is a circuit diagram of a diplexer in accordance with a third embodiment. As illustrated in FIG. 15, an LPF 60 is connected between a common terminal Ant and a terminal TL. An HPF 62 is connected between the common terminal Ant and the terminal TH. The LPF 60 is the filter circuit according to any one of the first embodiment and the variations thereof, and the HPF 62 is the filter circuit according to any one of the second embodiment and the variations thereof. This configuration improves the steepness of the cutoff characteristics of the LPF 60 and the HPF 62. Thus, band signals can be divided even when the distance between band is narrow. One of the LPF 60 and the HPF 62 may be the filter circuit of the first embodiment or the second embodiment. By combining the filter circuits of the first and second embodiments and the variations thereof, multiplexers such as duplexers, triplexers, or quadplexers in addition to diplexers can be achieved. Thus, as with the system utilizing Carrier Aggregation or Multiple-Input and Multiple-Output (MIMO), band signals can be divided even when the distance between bands is narrow.

Fourth Embodiment

Figure 16:
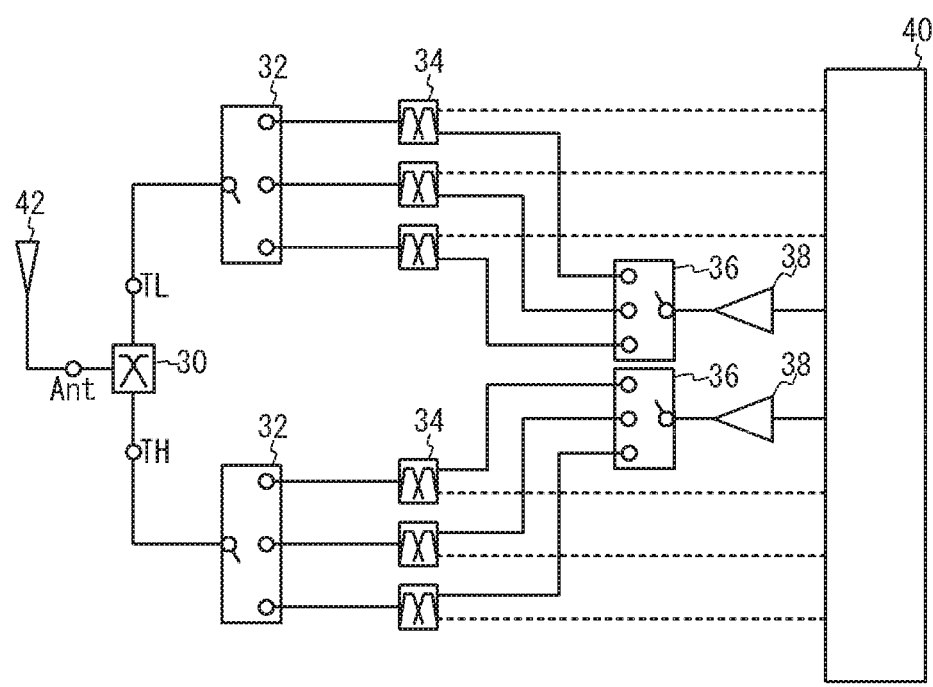
FIG. 16 is a circuit diagram of a front end circuit including a module in accordance with a fourth embodiment.

FIG. 16 is a circuit diagram of a front end circuit including a module in accordance with a fourth embodiment. As illustrated in FIG. 16, the common terminal Ant of a diplexer 30 is coupled to an antenna 42. Each of terminals TL and TH of the diplexer 30 is coupled to a duplexer 34 via a switch 32. An RX terminal of the duplexer 34 is coupled to a Radio Frequency Integrated Circuit (RFIC) 40 as indicated by the dashed line. A TX terminal of the duplexer 34 is coupled to the Radio Frequency Integrated Circuit (RFIC) 40 via a switch 36 and a power amplifier 38 as indicated by the solid line.

The power amplifier 38 amplifies transmission signals output from the RFIC 40. The switch 36 outputs the amplified transmission signal to the transmit terminal of one of one or a plurality of the duplexers 34. The duplexer 34 outputs signals in the transmit band to the switch 32 among high-frequency signals input to the transmit terminal, and suppresses signals with other frequencies. The duplexer 34 outputs signals in the receive band to the RFIC 40 among high-frequency signals input from the switch 32, and suppresses signals with other frequencies. The RFIC 40 includes a low noise amplifier, and amplifies signals in the receive band.

The switch 32 couples one of one or a plurality of the duplexers 34 to the terminal TL or TH. The diplexer 30 causes signals in the Low Band input to or output from the terminal TL to output from or input to the common terminal Ant, and prevents signals in the High Band from being input to or output from the terminal TL.

The diplexer 30 causes signals in the Low Band input to or output from the terminal TL to be output from or input to the common terminal Ant, and prevents signals in the High Band from being input to or output from the terminal TL. The diplexer 30 causes signals in the High Band input to or output from the terminal TH to be output from or input to the common terminal Ant, and prevents signals in the Low Band from being input to or output from the terminal TH.

In FIG. 16, the diplexer 30 may be the diplexer of the third embodiment. In addition, the filter included in the duplexer 34 may be the filter circuit according to any one of the first and second embodiments and the variations thereof.

Figure 17A:
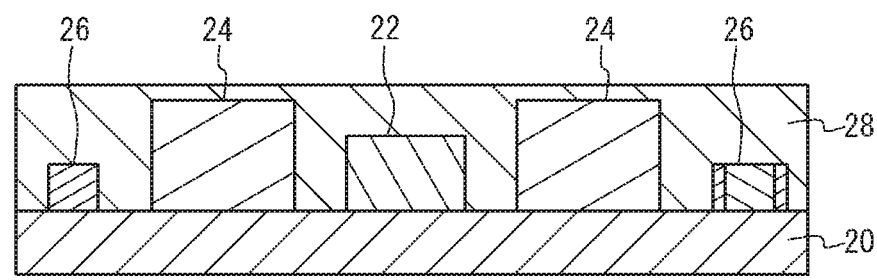
FIG. 17A through FIG. 17C are cross-sectional views of the module in accordance with the fourth embodiment.
Figure 17B:
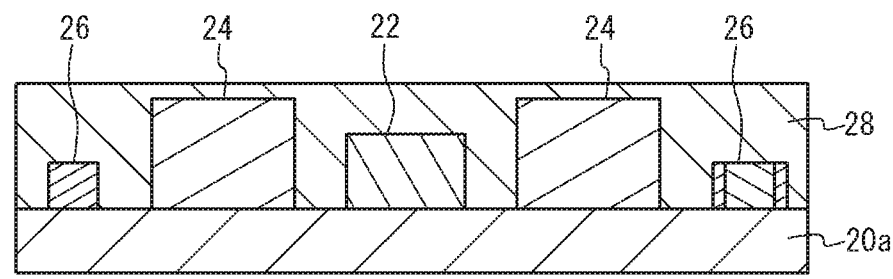
Figure 17C:
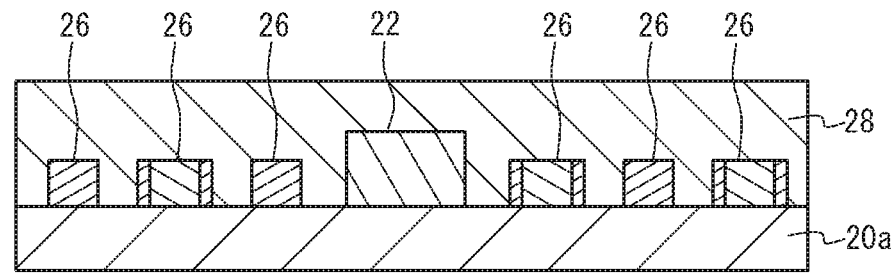
Figure 18A:
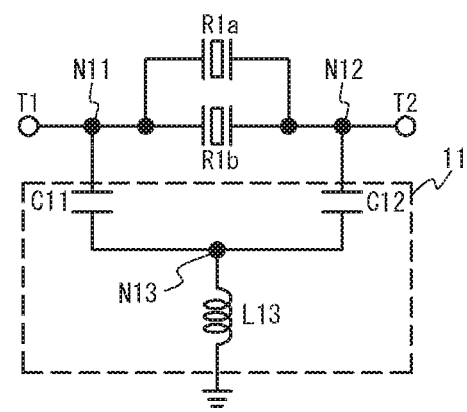
Figure 18B:
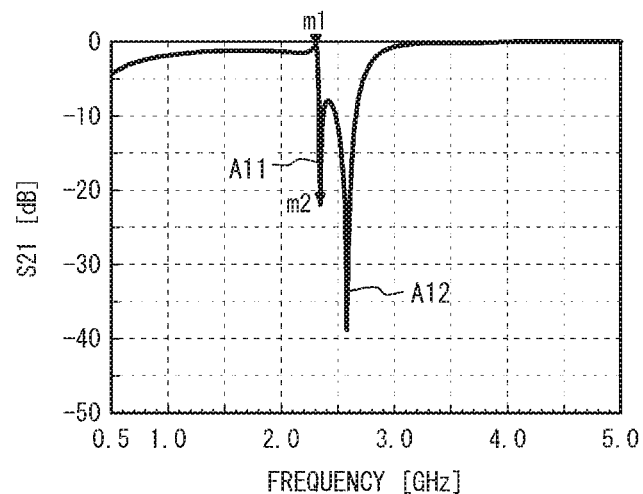
Figure 18C:
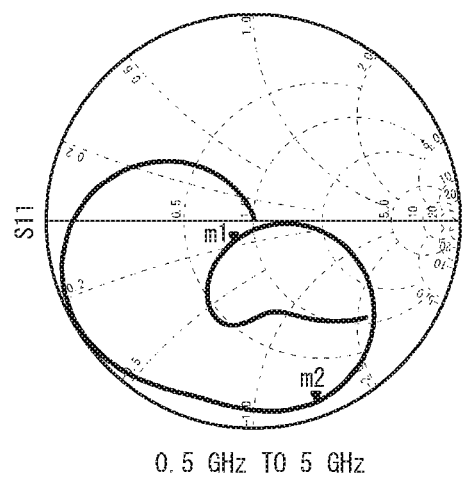

FIG. 17A through FIG. 17C are cross-sectional views of the module in accordance with the fourth embodiment. As illustrated in FIG. 17A, an acoustic wave resonator 22, multi-layer filters 24, and chip components 26 are mounted on a printed circuit board 20. A resin sealing portion 28 is located on the printed circuit board 20 so as to cover the acoustic wave resonator 22, the multi-layer filters 24, and the chip components 26. The printed circuit board 20 is, for example, a substrate having wiring lines formed on an insulating substrate made of glass epoxy resin or the like. The resin sealing portion 28 is made of mold resin such as epoxy resin.

As the acoustic wave resonator 22, provided is the acoustic wave resonators R1, R1a, and R1b and/or at least one of the acoustic wave resonators of the duplexer 34 in the first and second embodiments and the variations thereof. As the multi-layer filter 24, provided is at least a part of the LC parallel resonant circuit 10 and/or the at least one of the filters of the diplexer 30 and the duplexer 34 according to the first and second embodiments and the variations thereof. As the chip component 26, provided is the LC parallel resonant circuit 10 and/or at least one of the capacitors and the inductors of the diplexer 30 in accordance with the first and second embodiments and the variations thereof.

As illustrated in FIG. 17B, instead of the printed circuit board 20, a ceramic substrate 20a made of Low Temperature Co-fired Ceramic (LTCC) or High Temperature Co-fired Ceramic (HTCC) may be used. Other structures are the same as those in FIG. 17A, and the description thereof is thus omitted.

As illustrated in FIG. 17C, the multi-layer filter 24 may not necessarily be provided. Other structures are the same as those illustrated in FIG. 17B, and the description thereof is thus omitted.

It is only required that at least one of the diplexer 30 and the duplexer 34 illustrated in FIG. 16 is included as a module.

Although the embodiments of the present invention have been described in detail, it is to be understood that the various change, substitutions, and alterations could be made hereto without departing from the spirit and scope of the invention.

What is claimed is:

1. A filter circuit comprising:
 a first element that is a first capacitor or a first inductor connected in series between an input terminal and an output terminal;
 a second element that is connected in parallel to the first element between the input terminal and the output terminal, is a second inductor when the first element is the first capacitor, and is a second capacitor when the first element is the first inductor;
 a third element that is connected in parallel to the first element and in series with the second element between the input terminal and the output terminal, is a third inductor when the first element is the first capacitor, and is a third capacitor when the first element is the first inductor; and an acoustic wave resonator having a first end coupled to a first node, which is between the second element and the third element, and a second end coupled to a ground terminal, wherein:

an attenuation pole mainly formed by the acoustic wave resonator has a first local minimum, a closest attenuation pole among one or more attenuation poles mainly formed by the first element, the second element and the third element has a second local minimum, and the first local minimum is located between a passband of the filter and the second local minimum, and the first node is connected to the second element only via the first element and the third element.

2. The filter circuit according to claim 1, wherein the filter circuit is a low-pass filter, and the second local minimum is located at a frequency higher than the first local minimum.

3. The filter circuit according to claim 1, wherein the filter circuit is a high-pass filter, and the second local minimum is located at a frequency lower than the first local minimum.

4. The filter circuit according to claim 1, further comprising:

a matching circuit located between the input terminal and a second node to which the first element and the second element are commonly coupled, between a third node to which the first element and the third element are commonly coupled and the output terminal, or between the input terminal and the second node and between the third node and the output terminal.

5. The filter circuit according to claim 1, wherein the first element is the first inductor.

6. The filter circuit according to claim 1, wherein the first element is the first capacitor.

7. The filter circuit according to claim 1, wherein the acoustic wave resonator includes a plurality of acoustic wave resonators connected in series or in parallel between the first node and the ground terminal.

8. The filter circuit according to claim 1, wherein the acoustic wave resonator includes an IDT (Interdigital Transducer).

9. The filter circuit according to claim 1, wherein the acoustic wave resonator includes a piezoelectric thin film resonator.

10. A multiplexer comprising:
a filter circuit according to claim 1.

11. A module comprising:
a filter circuit according to claim 1.

12. A filter circuit comprising:

a first element that is a first capacitor or a first inductor connected in series between an input terminal and an output terminal;

a second element that is connected in parallel to the first element between the input terminal and the output terminal, is a second inductor when the first element is the first capacitor, and is a second capacitor when the first element is the first inductor;

a third element that is connected in parallel to the first element and in series with the second element between the input terminal and the output terminal, is a third inductor when the first element is the first capacitor, and is a third capacitor when the first element is the first inductor;

an acoustic wave resonator having a first end coupled to a first node, which is between the second element and the third element, and a second end coupled to a ground terminal, wherein:

the first element includes a fourth element and a fifth element connected in series between the input terminal and the output terminal, the filter circuit includes a sixth element that has a first end coupled to a second node, which is between the fourth element and the fifth element, and a second end coupled to a ground terminal, the sixth element being a fourth inductor when the first element is the first inductor and being a fourth capacitor when the first element is the first capacitor.

* * * * *